United States Patent
van der Straten et al.

(10) Patent No.: US 12,250,827 B2
(45) Date of Patent: Mar. 11, 2025

(54) MAGNETO-RESISTIVE RANDOM ACCESS MEMORY WITH SUBSTITUTIONAL BOTTOM ELECTRODE

(71) Applicant: International Business Machines Corporation, Armonk, NY (US)

(72) Inventors: Oscar van der Straten, Guilderland Center, NY (US); Lisamarie White, Staatsburg, NY (US); Willie Lester Muchrison, Jr., Troy, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 517 days.

(21) Appl. No.: 17/644,570

(22) Filed: Dec. 16, 2021

(65) Prior Publication Data
US 2023/0200086 A1   Jun. 22, 2023

(51) Int. Cl.
*H10B 61/00* (2023.01)
*G11C 11/16* (2006.01)
*H10N 50/01* (2023.01)
*H10N 50/80* (2023.01)
*H10N 50/85* (2023.01)

(52) U.S. Cl.
CPC ............ *H10B 61/00* (2023.02); *G11C 11/161* (2013.01); *H10N 50/01* (2023.02); *H10N 50/80* (2023.02); *H10N 50/85* (2023.02)

(58) Field of Classification Search
CPC ........ H10N 50/01; H10N 50/10; H10N 50/80; H10N 50/85; H10B 61/00; H10B 61/20; H10B 61/22; G11C 11/161; G11C 11/1655; G11C 11/1657; G11C 11/1659; G11C 2211/5615; G01R 33/098; G11B 5/3909
See application file for complete search history.

(56) References Cited

U.S. PATENT DOCUMENTS

| | | | |
|---|---|---|---|
| 9,502,640 B1 | 11/2016 | Annunziata | |
| 9,559,294 B2 | 1/2017 | Hsu | |
| 9,917,137 B1 | 3/2018 | Briggs | |
| 10,707,413 B1 | 7/2020 | Dutta | |
| 10,892,403 B2 | 1/2021 | Marchack | |
| 10,937,945 B2 | 3/2021 | Marchack | |
| 11,024,670 B1 | 6/2021 | Reznicek | |
| 2009/0209050 A1 | 8/2009 | Wang | |
| 2011/0049655 A1 | 3/2011 | Assefa | |
| 2015/0194602 A1* | 7/2015 | Liao | H10N 70/826 257/4 |
| 2016/0035969 A1* | 2/2016 | Kang | H10B 61/10 257/421 |
| 2016/0072050 A1* | 3/2016 | Yoshikawa | H10N 50/10 257/421 |
| 2019/0157548 A1* | 5/2019 | Wu | H10N 50/80 |
| 2020/0006641 A1* | 1/2020 | Liou | H10B 61/20 |
| 2021/0043827 A1* | 2/2021 | Hashemi | H10B 61/00 |

(Continued)

*Primary Examiner* — Mouloucoulaye Inoussa
(74) *Attorney, Agent, or Firm* — Matthew Zehrer (57) ABSTRACT

A magnetic tunnel junction pillar is positioned above a bottom electrode composed of a metal-oxide region in contact with a first portion of the magnetic tunnel junction pillar and a metal region surrounding the metal-oxide region. A sidewall spacer is positioned along sidewalls of the magnetic tunnel junction pillar, and the metal region is in contact with a bottom surface of the sidewall spacer and a second portion of the magnetic tunnel junction pillar.

20 Claims, 11 Drawing Sheets

(56) References Cited

U.S. PATENT DOCUMENTS

| | | |
|---|---|---|
| 2021/0066581 A1 | 3/2021 | Doris |
| 2021/0091303 A1 | 3/2021 | Patlolla |
| 2021/0159270 A1 | 5/2021 | Reznicek |
| 2022/0029091 A1* | 1/2022 | Wang .................... H10N 50/80 |
| 2022/0302375 A1* | 9/2022 | Chiu ..................... H10N 50/01 |
| 2022/0336732 A1* | 10/2022 | Yang .................... H10N 50/80 |
| 2022/0393101 A1* | 12/2022 | Lee ....................... H10N 50/01 |

* cited by examiner

MAGNETO-RESISTIVE RANDOM ACCESS MEMORY WITH SUBSTITUTIONAL BOTTOM ELECTRODE

BACKGROUND

The present invention generally relates to the field of magnetic storage devices, and more particularly to high performance magneto-resistive random access memory devices.

Magneto-resistive random access memory (MRAM) is a non-volatile random access memory technology in which data is stored by magnetic storage elements. These magnetic storage elements are typically formed from two ferromagnetic plates, each of which can hold a magnetization, separated by a thin dielectric layer, i.e., the tunnel barrier. One of the two plates is a permanent magnet set to a particular polarity; the other plate's magnetization can be changed to match that of an external field to store memory. Such configuration is known as a magnetic tunnel junction (MTJ) pillar.

For high performance MRAM devices based on perpendicular MTJ pillars, well-defined interfaces and interface control are essential. Embedded MTJ pillar structures are usually formed by patterning of blanket MTJ stacks. Reactive-ion etch (RIE), and ion-beam etch (IBE) processing of such MTJ stacks presents a major challenge, as it typically leads to electrical shorts due to re-sputtering of underlying thick bottom metal layers onto MTJ stack sidewalls.

SUMMARY

Therefore, there is a need for improved designs and techniques that can prevent the deposition of re-sputtered conductive metal particles from underlying (thick) bottom metal layers on sidewalls of the MTJ stack.

Shortcomings of the prior art are overcome and additional advantages are provided through the provision of a memory device that includes a magnetic tunnel junction pillar above a bottom electrode, the bottom electrode including a metal-oxide region in contact with a first portion of the magnetic tunnel junction pillar and a metal region surrounding the metal-oxide region, and a sidewall spacer along sidewalls of the magnetic tunnel junction pillar, the metal region is in contact with a bottom surface of the sidewall spacer and a second portion of the magnetic tunnel junction pillar.

Another embodiment of the present disclosure provides a memory device that includes a magnetic tunnel junction pillar above a bottom electrode, and a sidewall spacer along sidewalls of the magnetic tunnel junction pillar, the bottom electrode includes a first region below a first portion of the magnetic tunnel junction pillar, the first region including a first metal-oxide layer, and a second region on opposite sides of the first region, the second region including a metal liner surrounding a second metal-oxide layer, a first segment of the metal liner being in contact with a bottom surface of the sidewall spacer and a second portion of the magnetic tunnel junction pillar, a second segment of the metal liner being in contact with the first metal-oxide layer, and a third segment of the metal liner, parallel to the first segment, being in contact with a metal cap located underneath the bottom electrode.

Another embodiment of the present disclosure provides a method of forming a memory device that includes forming a first metal-oxide layer above a metal cap located on a first interconnect structure, forming a magnetic tunnel junction stack above the first metal-oxide layer, patterning the magnetic tunnel junction stack to form a magnetic tunnel junction pillar, forming a sidewall spacer along sidewalls of the magnetic tunnel junction pillar, etching the first metal-oxide layer to expose a bottom surface of the sidewall spacer and a bottom surface of a first portion of the magnetic tunnel junction pillar, a second portion of the magnetic tunnel junction pillar remains in contact with the first metal-oxide layer, and forming a metal layer on opposite sides of the first metal-oxide layer, the metal layer is in contact with the first portion of the magnetic tunnel junction pillar for providing a bottom electrode.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

MRAM devices include cells or magnetic storage elements for storing data having a magnetically hard layer (i.e., the reference layer) and a magnetically soft layer (i.e., the free layer) separated by a thin dielectric layer (i.e., the tunnel barrier). This configuration is known as a magnetic tunnel junction (MTJ) pillar. MTJ pillar structures typically include a cobalt (Co)-based synthetic anti-ferromagnet (SAF), a CoFeB-based reference layer, a MgO-based tunnel barrier, a CoFeB-based free layer, and cap layers containing materials such as tantalum (Ta) and/or ruthenium (Ru). As mentioned above, embedded MTJ pillar structures are usually formed by patterning of blanket MTJ stacks. Reactive-ion etch (RIE) and ion beam etch (IBE) processing of such MTJ stacks presents a major challenge, as it typically leads to shorts due to re-sputtering of thick bottom metal layers onto sidewalls of the MTJ stack.

Embodiments of the present disclosure provide a memory device, and a method of making the same, in which the bottom electrode is formed after patterning the MTJ stack such that no metal re-sputtering from bottom metal layers can occur during patterning of the MTJ stack. Specifically, in the proposed embodiments, the MTJ stack is formed above a metal-oxide layer (e.g., $Al_2O_3$, $TiO_2$, $HfO_2$) that acts as a underlayer dielectric during patterning of the MTJ stack. After forming the MTJ pillar and sidewalls spacers, the metal-oxide layer is recessed until exposing a bottom surface of the MTJ pillar, the recessed regions are then filled with a conductive material including metal nitrides (e.g., TiN, TaN, WN) or metals (e.g., Mo, W, Ru) that can be used as substitutional bottom electrode materials. Thus, by forming the bottom electrode after MTJ stack patterning, embodiments of the present disclosure can prevent re-sputtering of thick bottom metal layers onto sidewalls of the MTJ stack, thereby reducing the risk of electrical shorts and increasing device yield and reliability.

An embodiment by which a memory device with substitutional bottom electrode can be formed is described in detailed below by referring to the accompanying drawings in FIGS. 1A-1L. Another embodiment by which the memory device with substitutional bottom electrode can be formed is described in detailed below by referring to the accompanying drawings in FIGS. 2A-2E.

Figure 1A:
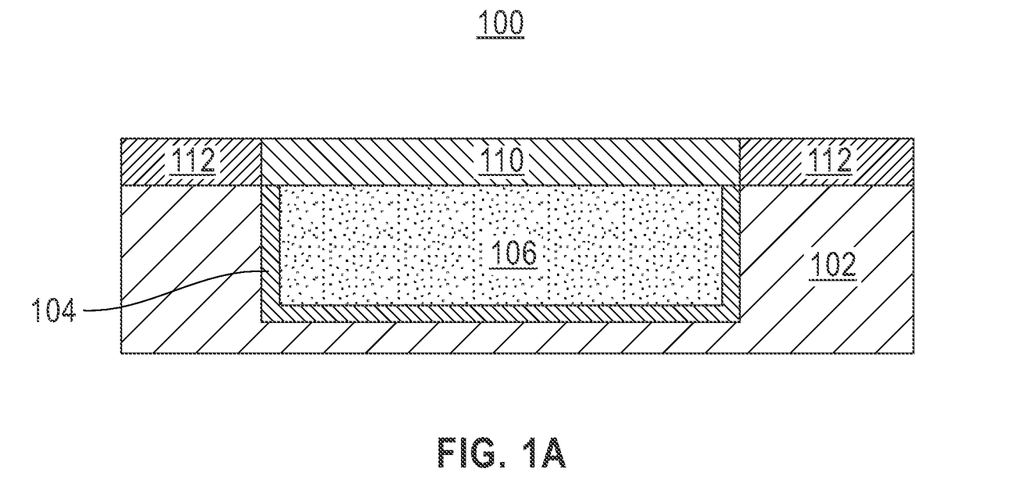
FIG. 1A is a cross-sectional view of a memory device at an intermediate step during a semiconductor manufacturing process, according to an embodiment of the present disclosure.

Referring now to FIG. 1A, a cross-sectional view of a memory device 100 at an intermediate step during a semiconductor manufacturing process is shown, according to an embodiment of the present disclosure. The memory device 100 may include any MTJ-containing device such as, for example, MRAM, spin-transfer torque (STT) MRAM, spin-orbit torque (SOT) MRAM and the like. In the embodiment of FIG. 1, the memory device 100 is an MRAM device based on a perpendicular MTJ pillar structure.

The memory device 100 includes a first conductive structure 106 that is embedded in an interconnect dielectric material or first dielectric layer 102. A first diffusion barrier liner 104 can be formed on sidewalls and a bottom surface of the first conductive structure 106, as shown in the figure. Collectively, the first conductive structure 106, the first diffusion barrier liner 104, and the first dielectric layer 102 provide an interconnect level. It should be noted that at least one other interconnect level and/or a middle-of-the-line (MOL) level may be located beneath the interconnect level formed by the first dielectric layer 102, the first conductive structure 106, and the first diffusion barrier liner 104. These other levels are not shown for clarity.

The first dielectric layer 102 can be composed of any interconnect dielectric material including, for example, silicon dioxide, silsesquioxanes, C doped oxides (i.e., organosilicates) that includes atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The first conductive structure 106 is composed of an electrically conductive metal or metal alloy. Examples of electrically conductive materials that may be used in the present application include copper (Cu), aluminum (Al), or tungsten (W), while an example of an electrically conductive metal alloy is a Cu—Al alloy.

As depicted in the figure, the first diffusion barrier liner 104 is formed along a bottom surface and sidewalls of the first conductive structure 106. In some embodiments, no diffusion barrier liner is present. The first diffusion barrier liner 104 is composed of a diffusion barrier material (i.e., a material that serves as a barrier to prevent a conductive material such as copper from diffusing there through). Examples of diffusion barrier materials that can be used in providing the first diffusion barrier liner 104 may include, but are not limited to, Ta, TaN, Ti, TiN, Ru, RuN, RuTa, RuTaN, W, or WN. In some embodiments, the first diffusion barrier liner 104 may include a stack of diffusion barrier materials. In one example, the diffusion barrier material may be composed of a stack of Ta/TaN.

The interconnect level including the first dielectric layer 102, the first conductive structure 106, and the first diffusion barrier liner 104 may be formed utilizing conventional processes that are well-known to those skilled in the art including, for example, a damascene process. So as not to obscure the method of the present application, the techniques used to form the interconnect level including the first dielectric layer 102, the first conductive structure 106, and the first diffusion barrier liner 104 are not provided herein.

The memory device 100 may further include a metal cap 110 formed within a second dielectric layer 112, as depicted in the figure. In one or more embodiments, the second dielectric layer 112 includes analogous materials and is formed in similar ways as the first dielectric layer 102. The metal cap 110 may be provided in cases where the first conductive structure 106 includes a reactive metal such as copper (Cu). In such cases, the metal cap 110 may include a less reactive capping material such as, for example, TaN, WN, and the like. The process of forming the metal cap 110 is standard and well-known in the art. Generally, the process includes depositing the second dielectric layer 112 above the first conductive structure 106 and the first dielectric layer 102, forming a via or trench feature (not shown) in the second dielectric layer 112 using standard patterning (lithography) and etching techniques until exposing the first conductive structure 106, and then filling the via or trench feature with the capping material using well-known conformal deposition processes, such as atomic layer deposition (ALD), or chemical vapor deposition (CVD). A thickness of the metal cap 110 may vary from approximately 5 nm to approximately 200 nm, and ranges therebetween.

Figure 1B:
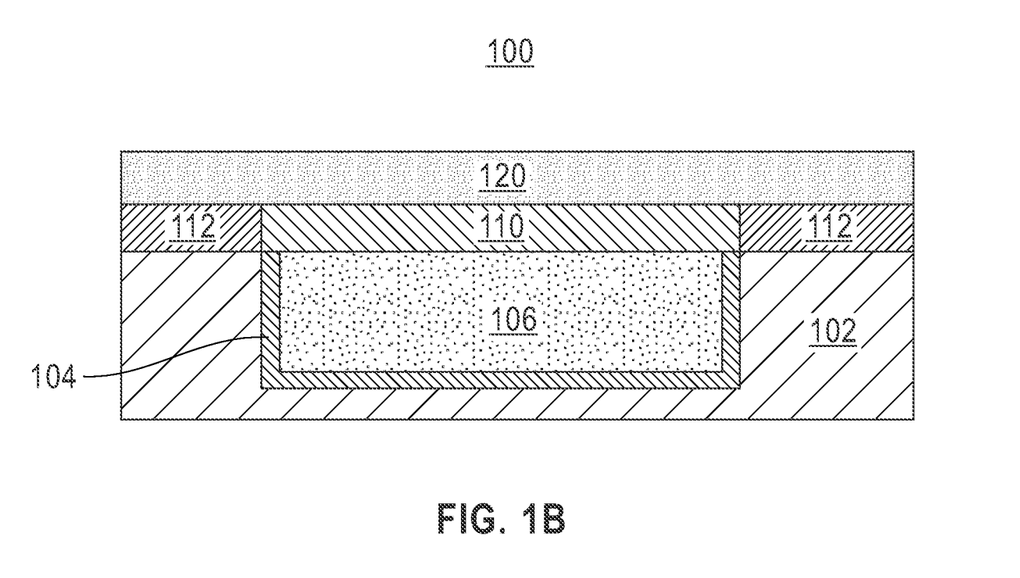
FIG. 1B is a cross-sectional view of the memory device after forming a first metal-oxide layer, according to an embodiment of the present disclosure.

Referring now to FIG. 1B, a cross-sectional view of the memory device 100 is shown after forming a first metal-oxide layer 120, according to an embodiment of the present disclosure.

The first metal-oxide layer 120 is formed above top surfaces of the metal cap 110 and second dielectric layer 112. In this embodiment, the first metal-oxide layer 120 may include a layer of a dielectric material such as, for example, $Al_2O_3$, $TiO_2$, $HfO_2$, and the like. The first metal-oxide layer 120 may be formed by a deposition process such as, for example, sputtering, atomic layer deposition (ALD), chemical vapor deposition (CVD), plasma enhanced chemical vapor deposition (PECVD) or physical vapor deposition (PVD). An etch back process, a planarization process (such as, for example, chemical mechanical polishing), or a patterning process (such as, for example, lithography and etching) may follow the deposition of the dielectric material that provides the first metal-oxide layer 120. The first metal-oxide layer 120 may have a thickness varying from approximately 2 nm to approximately 25 nm and ranges there between, although a thickness less than 2 nm and greater than 25 nm may be acceptable.

Figure 1C:
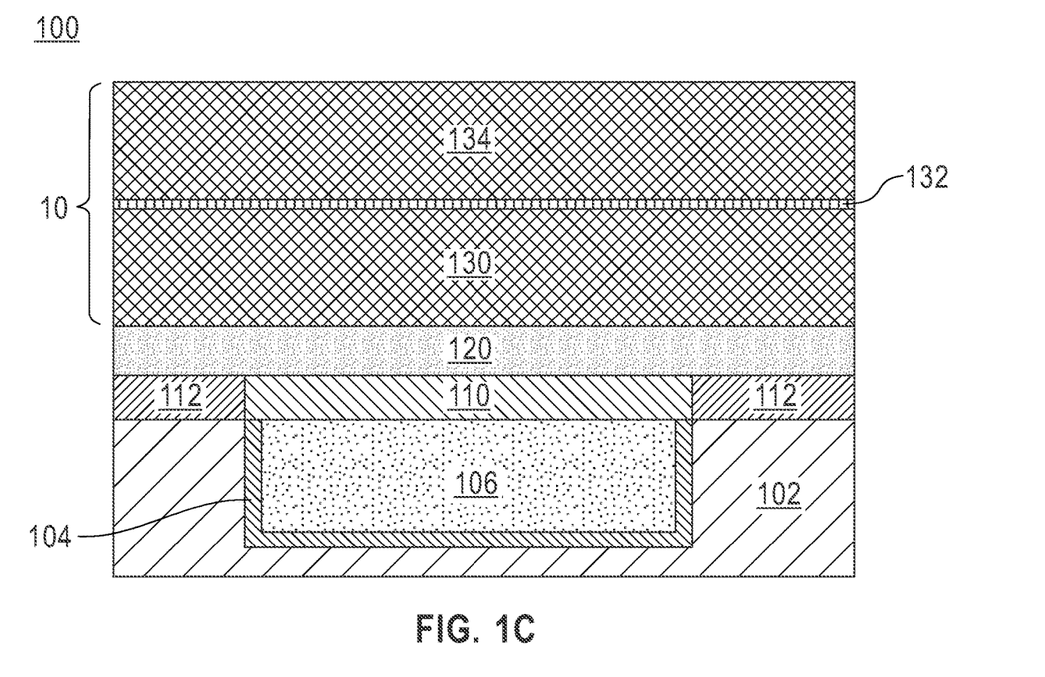
FIG. 1C is a cross-sectional view of the memory device after forming a magnetic tunnel junction stack, according to an embodiment of the present disclosure.

Referring now to FIG. 1C, a cross-sectional view of the memory device 100 is shown after forming an MTJ stack 10 above the first metal-oxide layer 120, according to an embodiment of the present disclosure. The MTJ stack 10 may include at least a magnetic reference layer 130, a tunnel barrier layer 132, and a magnetic free layer 134 as depicted in the figure. It should be noted that other configurations are possible for the MTJ stack 10 including, for example, the magnetic free layer 134 being located at the bottom of the MTJ stack 10 and the magnetic reference layer 130 being at the top of the MTJ stack 10.

In some embodiments, the MTJ stack 10 may also include a non-magnetic spacer layer (not shown) located on the magnetic free layer, a second magnetic free layer located on the non-magnetic spacer layer, and/or a MTJ cap layer located on the magnetic free layer 134 or on the second magnetic free layer. The various material layers of the MTJ stack 10 can be formed by utilizing one or more deposition processes such as, for example, plating, sputtering, plasma enhanced atomic layer deposition (PEALD), plasma enhanced chemical vapor deposition (PECVD) or physical vapor deposition (PVD).

The magnetic reference layer 130 has a fixed magnetization. The magnetic reference layer 130 may be composed of a metal or metal alloy (or a stack thereof) that includes one or more metals exhibiting high spin polarization. In alternative embodiments, exemplary metals for the formation of the magnetic reference layer 130 may include iron, nickel, cobalt, chromium, boron, or manganese. Exemplary metal alloys may include the metals exemplified by the above. In another embodiment, the magnetic reference layer 130 may be a multilayer arrangement having (1) a high spin polarization region formed from a metal and/or metal alloy using the metals mentioned above, and (2) a region constructed of a material or materials that exhibit strong perpendicular magnetic anisotropy (strong PMA). Exemplary materials with strong PMA that may be used include a metal such as cobalt, nickel, platinum, palladium, iridium, or ruthenium, and may be arranged as alternating layers. The strong PMA region may also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys may be arranged as alternating layers. In one embodiment, combinations of these materials and regions may also be employed.

The tunnel barrier layer 132 is composed of an insulator material and is formed at such a thickness as to provide an appropriate tunneling resistance. Exemplary materials for the tunnel barrier layer 132 may include magnesium oxide, aluminum oxide, and titanium oxide, or materials of higher electrical tunnel conductance, such as semiconductors or low-bandgap insulators.

The magnetic free layer 134 may be composed of a magnetic material (or a stack of magnetic materials) with a magnetization that can be changed in orientation relative to the magnetization orientation of the magnetic reference layer 130. Exemplary magnetic materials for the magnetic free layer 134 include alloys and/or multilayers of cobalt, iron, alloys of cobalt-iron, nickel, alloys of nickel-iron, and alloys of cobalt-iron-boron.

Although not depicted in the figure, in one or more embodiments, a hardmask layer is subsequently formed above the magnetic free layer 134 of the MTJ stack 10. According to an embodiment, the hardmask layer (not shown) may be composed of a metal such as TaN, TaAlN, WN as the bottommost material, and a dielectric material such as silicon dioxide, silicon nitride, silicon carbide, and the like, as the topmost material. For ease of illustration the hardmask layer is not depicted in the figures. The hardmask layer can be deposited by any suitable deposition method known in the art. It should be noted that the metal layer in the hardmask layer is not sacrificial, while the dielectric layer in the hardmask layer is sacrificial, in that the dielectric layer will be removed after completion of the patterning process. In some embodiments, top layers (not shown) of the MTJ stack 10 may act as both a hardmask for etching the MTJ stack 10 and as an interlayer conductor channel. A (vertical) thickness of the hardmask layer may vary between approximately 10 nm to approximately 100 nm, although other thicknesses above or below this range may be used as desired for a particular application.

Figure 1D:
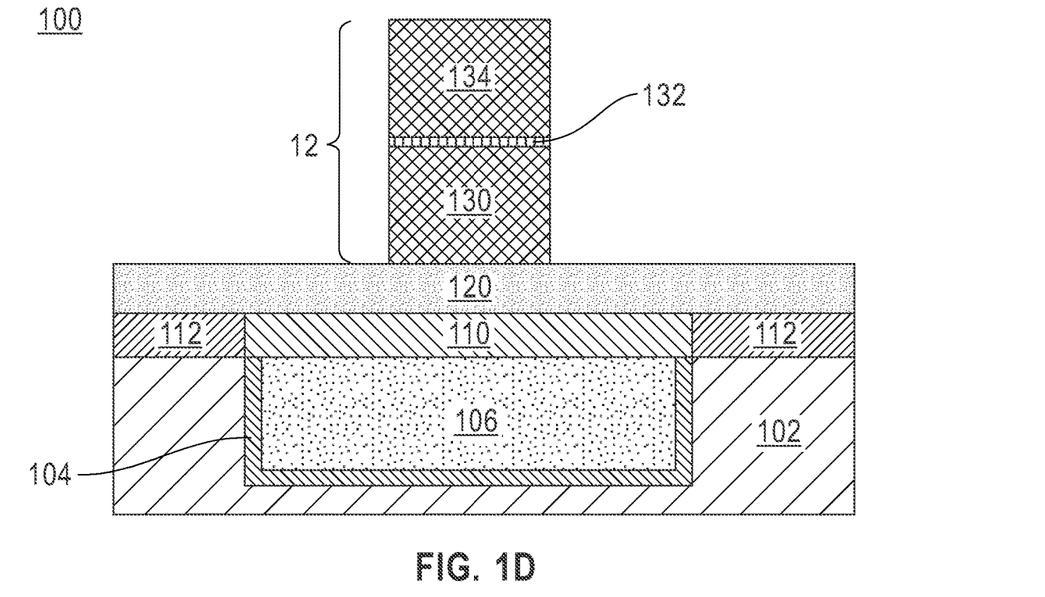
FIG. 1D is a cross-sectional view of the memory device after patterning the magnetic tunnel junction stack to form a magnetic tunnel junction pillar, according to an embodiment of the present disclosure.

Referring now to FIG. 1D, a cross-sectional view of the memory device 100 is shown after patterning the MTJ stack 10 (FIG. 1C) to form an MTJ pillar 12, according to an embodiment of the present disclosure.

The process of patterning the MTJ stack 10 (FIG. 1C) consists of steps well-known in the art, which generally include forming a pattern on a photoresist layer (not shown) that is transferred to a hardmask layer (not shown) and used to pattern the underlying MTJ stack 10 (FIG. 1C) via any suitable etching technique. Non-limiting examples of etching techniques for patterning the MTJ stack 10 (FIG. 1C) may include reactive-ion etching (RIE) or ion beam etching (IBE). In this embodiment, etching of the MTJ stack 10 (FIG. 1C) is conducted until reaching a top surface of the first metal-oxide layer 120.

It should be noted that some elements and/or features of the memory device 100 are illustrated in the figures but not described in detail in order to avoid unnecessarily obscuring the presented embodiments. For illustration purposes only, without intent of limitation, only one MTJ pillar 12 is depicted in the figure. As may be understood by those skilled in the art, more than one MTJ pillar 12 can be formed in the memory device 100.

Figure 1E:
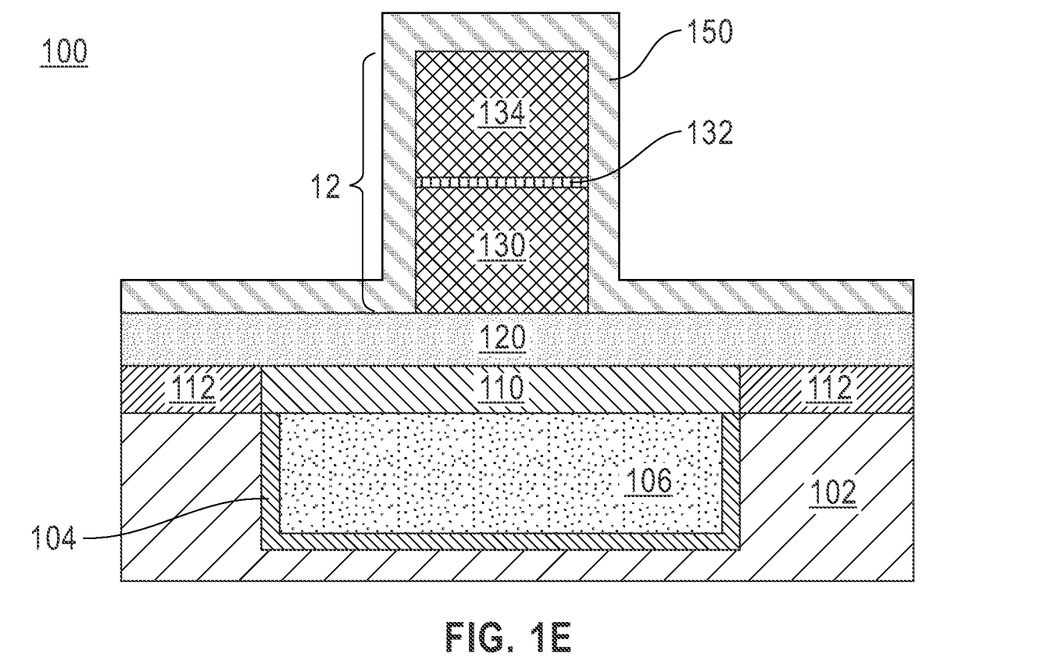
FIG. 1E is a cross-sectional view of the memory device after forming a spacer material, according to an embodiment of the present disclosure.

Referring now to FIG. 1E, a cross-sectional view of the memory device 100 is shown after forming a spacer material 150, according to an embodiment of the present disclosure.

The spacer material 150 may include an insulator material such as an oxide, nitride, oxynitride, silicon carbon oxynitride, silicon boron oxynitride, low-k dielectric, or any combination thereof. Standard conformal deposition techniques may be used to form the spacer material 150. The spacer material 150 can be deposited on the memory device 100 and then etched to form sidewall spacers, as will be described in detail below.

Figure 1F:
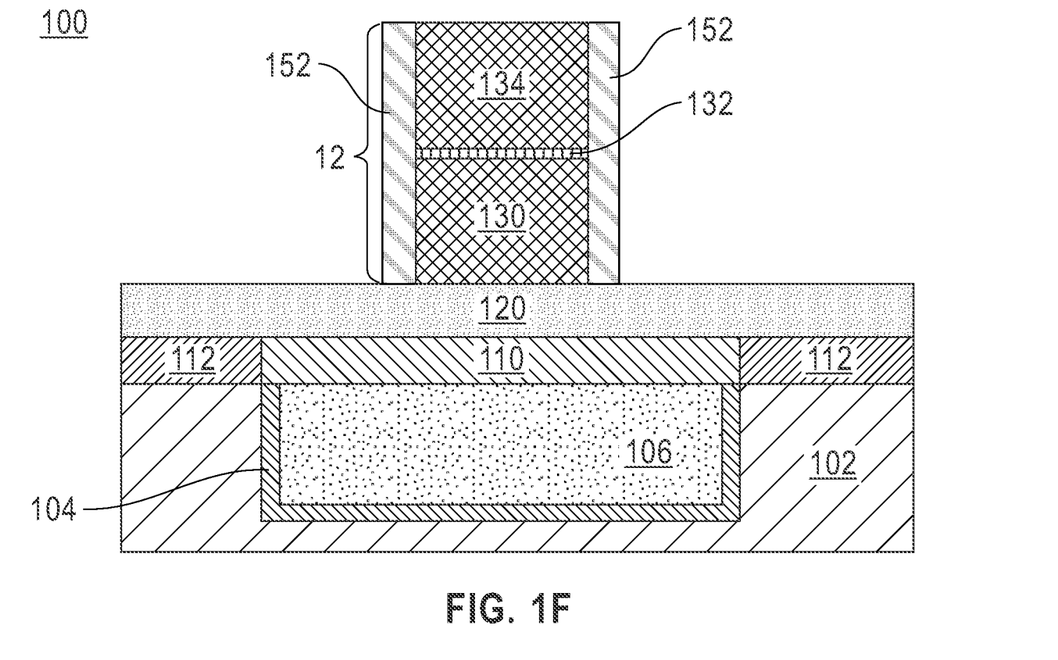
FIG. 1F is a cross-sectional view of the memory device after etching the spacer material and forming sidewall spacers, according to an embodiment of the present disclosure.

Referring now to FIG. 1F, a cross-sectional view of the memory device 100 is shown after etching the spacer material 150 and forming sidewall spacers 152, according to an embodiment of the present disclosure. The spacer material 150 (FIG. 1E) can be etched using, for example, an anisotropic etch to form the sidewall spacers 152. As depicted in the figure, the spacer material 150 (FIG. 1E) is removed from all horizontal surfaces of the memory device 100 during the etching process.

According to an embodiment, the sidewall spacers 152 are located along sidewalls of the MTJ pillar 12 substantially covering this region of the memory device 100. Stated differently, the sidewall spacers 152 act as an encapsulation material that surrounds and protects the MTJ pillar 12 during subsequent processing steps. In an exemplary embodiment, a thickness of the sidewall spacers 152 may vary between approximately 3 nm to approximately 40 nm, although other thicknesses above or below this range may be used as desired for a particular application.

Figure 1G:
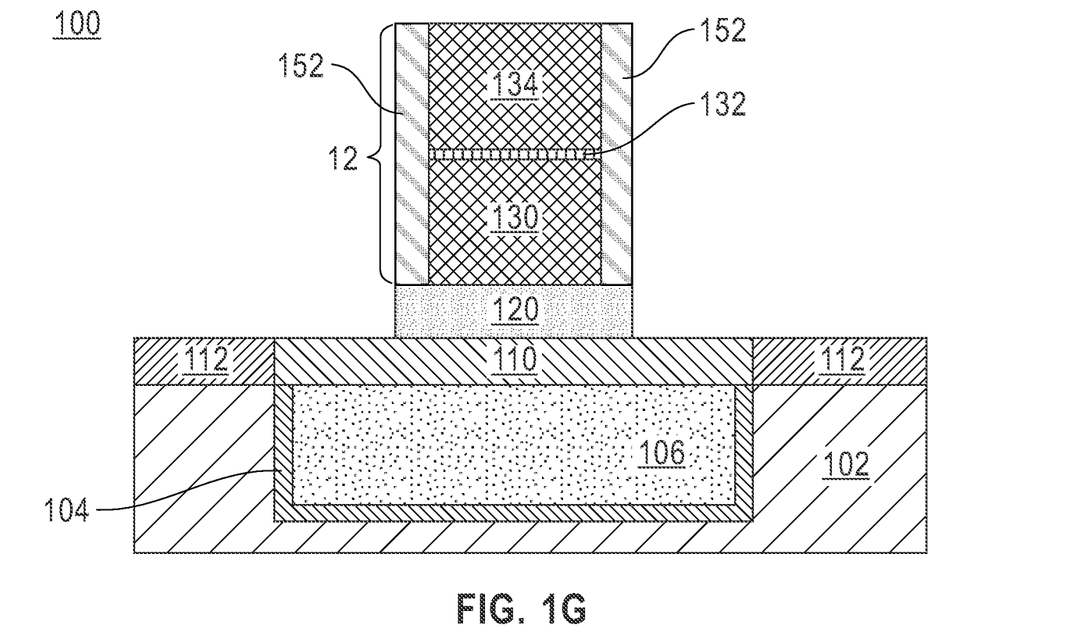
FIG. 1G is a cross-sectional view of the memory device after etching outer portions of the first metal-oxide layer, according to an embodiment of the present disclosure.

Referring now to FIG. 1G, a cross-sectional view of the memory device 100 is shown after etching outer portions of the first metal-oxide layer 120, according to an embodiment of the present disclosure.

In this embodiment, dry etching techniques such as reactive ion etch (RIE) or ion beam etch (IBE) can be used to etch (outer) first portions of the first metal-oxide layer 120 that extend outwards from the sidewall spacers 152. Stated differently, first portions of the first metal-oxide layer 120 not covered by the sidewalls spacers 152 are removed from the memory device 100. It should be noted that second portions of the first metal-oxide layer 120 located underneath the MTJ pillar 12 and the sidewalls spacers 152 remain in the memory device 100.

Figure 1H:
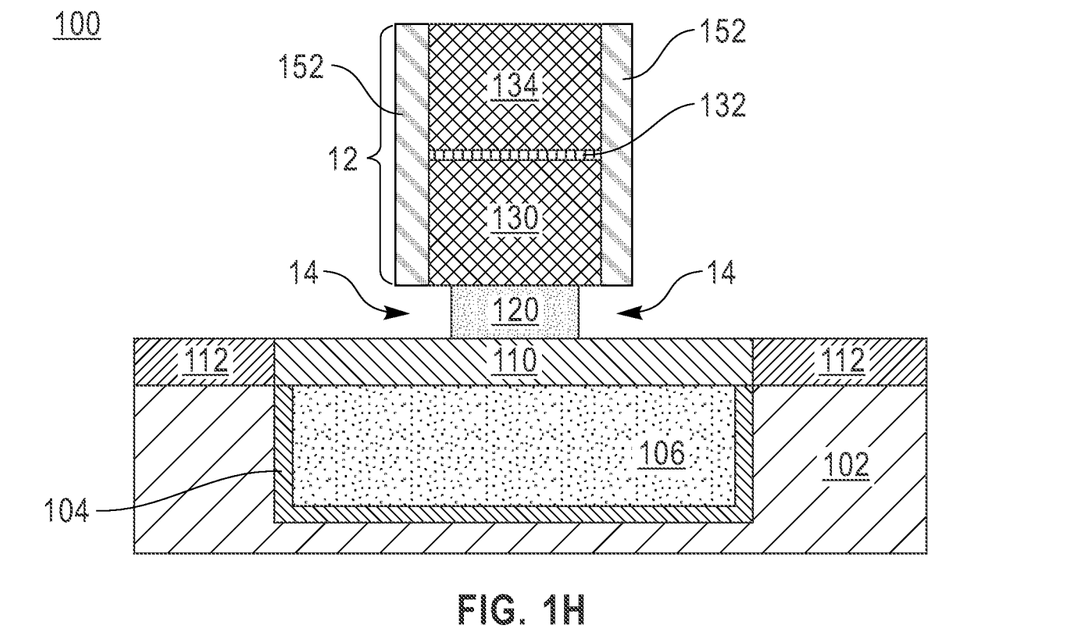
FIG. 1H is a cross-sectional view of the memory device after etching portions of the first metal-oxide layer underneath the magnetic tunnel junction pillar and the sidewalls spacers, according to an embodiment of the present disclosure.

Referring now to FIG. 1H, a cross-sectional view of the memory device 100 is shown after partially etching second portions of the first metal-oxide layer 120 located underneath the MTJ pillar 12 and the sidewalls spacers 152, according to an embodiment of the present disclosure.

As depicted in the figure, second portions of the first metal-oxide layer 120 located underneath the sidewalls spacers 152 and the MTJ pillar 12 can be recessed using any suitable etching technique. In this embodiment, dry etching techniques (e.g., RIE or IBE) or wet etch removal can be used to etch the second portions of the first metal-oxide layer 120. It should be noted that both etching steps can be done at the same time with one etch process, for example RIE, or wet etch removal. However, since RIE is predominantly directional, a two-step process (e.g., first RIE removal, then wet etch removal) is the more relevant sequence of steps.

After the etching process, a remaining third portion of the first metal-oxide layer 120 stays underneath a central region of the MTJ pillar 12. Recesses 14 are formed on opposite sides of the remaining third portion of the first metal-oxide layer 120 and a bottom surface of the MTJ pillar 12. As can be observed in the figure, the recesses 14 expose a bottom surface of the MTJ pillar 12 and a top surface of the metal cap 110. In an exemplary embodiment, the etching process can be conducted until a (horizontal) thickness of the remaining third portion of the first metal-oxide layer 120 varies from approximately 10 nm to approximately 100 nm.

Figure 1I:
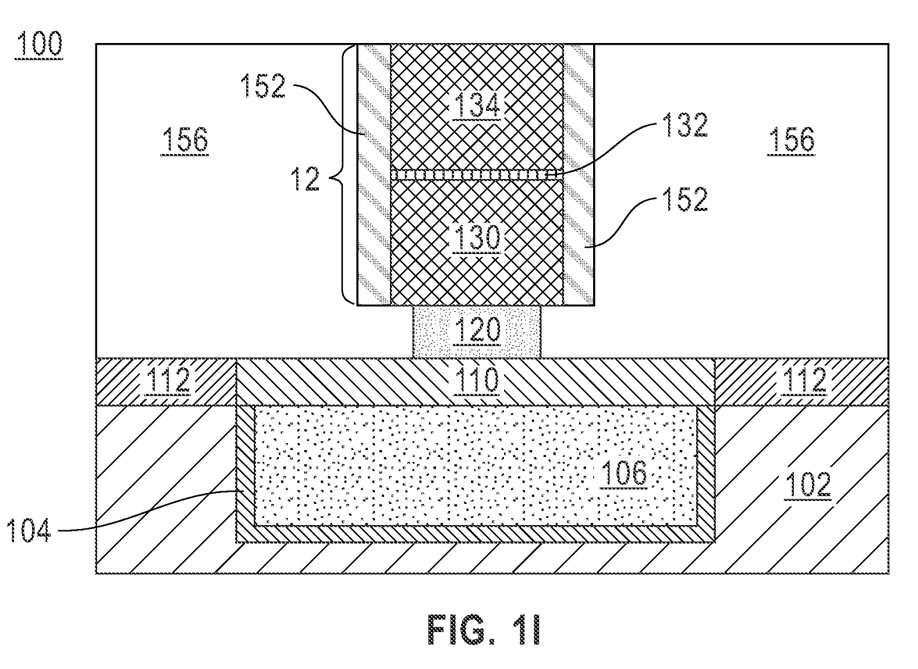
FIG. 1I is a cross-sectional view of the memory device after depositing a first metal layer, according to an embodiment of the present disclosure.

Referring now to FIG. 1I, a cross-sectional view of the memory device 100 is shown after depositing a first metal layer 156, according to an embodiment of the present disclosure.

The first metal layer 156 can be conformally deposited on the memory device 100 using, for example, an atomic layer deposition (ALD) process. The first metal layer 156 may be composed of an electrically conductive material such as, for example, Ta, TaN, Ti, TiN, Ru, RuN, RuTa, RuTaN, W, WN or any combination thereof. The first metal layer 156 substantially fills the recesses 14 depicted in FIG. 1H.

Figure 1J:
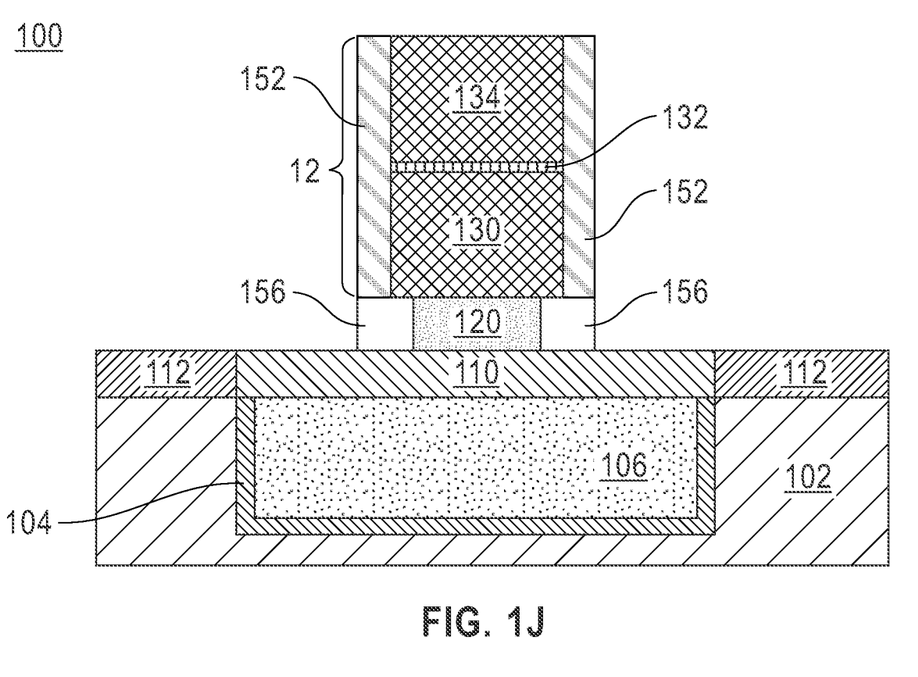
FIG. 1J is a cross-sectional view of the memory device after etching the first metal layer, according to an embodiment of the present disclosure.

Referring now to FIG. 1J, a cross-sectional view of the memory device 100 is shown after etching the first metal layer 156, according to an embodiment of the present disclosure.

In this embodiment, an etch back process is conducted on the first metal layer 156. After conducting the etch back process, only portions of the first metal layer 156 located underneath the MTJ pillar 12 and the sidewall spacers 152 remain in the memory device 100 (i.e., portions of the first metal layer 156 filling the recesses 14 shown in FIG. 1H). Thus, the remaining portions of the first metal layer 156 are in contact with opposite sides of the third portion of the first metal-oxide layer 120, a bottom surface of the MTJ pillar 12, a bottom surface of the sidewall spacers 152, and a top surface of the metal cap 110, as shown in the figure. Although not depicted in the figure, it should be noted that the first metal layer 156 surrounds the first metal-oxide layer 120 located underneath the MTJ pillar 12 providing a hollow ring-shaped bottom electrode.

Remaining portions of the first metal layer 156 on opposite sides of the first metal-oxide layer 120 may have a thickness varying from approximately 2 nm to approximately 25 nm and ranges there between, although a thickness less than 2 nm and greater than 25 nm may be acceptable.

Accordingly, the first metal-oxide layer 120 and the first metal layer 156 form the bottom electrode of the memory device 100. In the proposed embodiments, the bottom electrode is formed after patterning the MTJ pillar 12 which can reduce tunnel barrier shorts caused by re-sputtering of bottom metals during patterning of the MTJ stack.

Figure 1K:
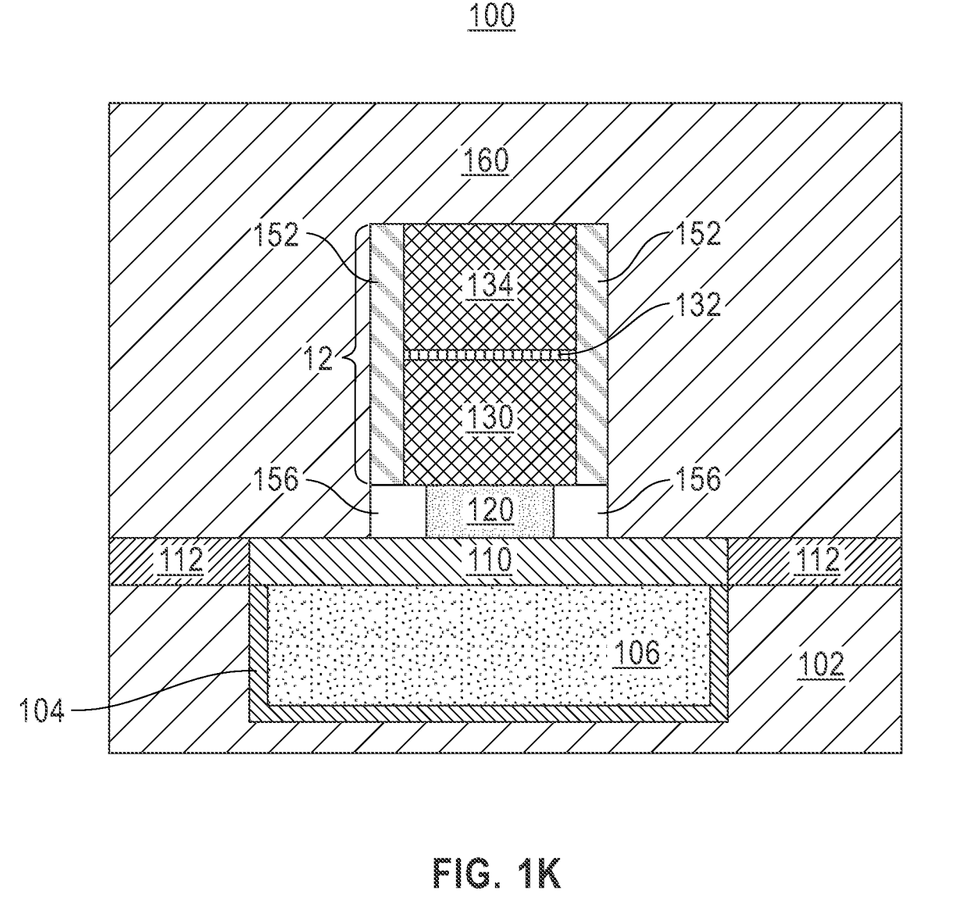
FIG. 1K is a cross-sectional view of the memory device after depositing a third dielectric layer, according to an embodiment of the present disclosure.
Figure 1L:
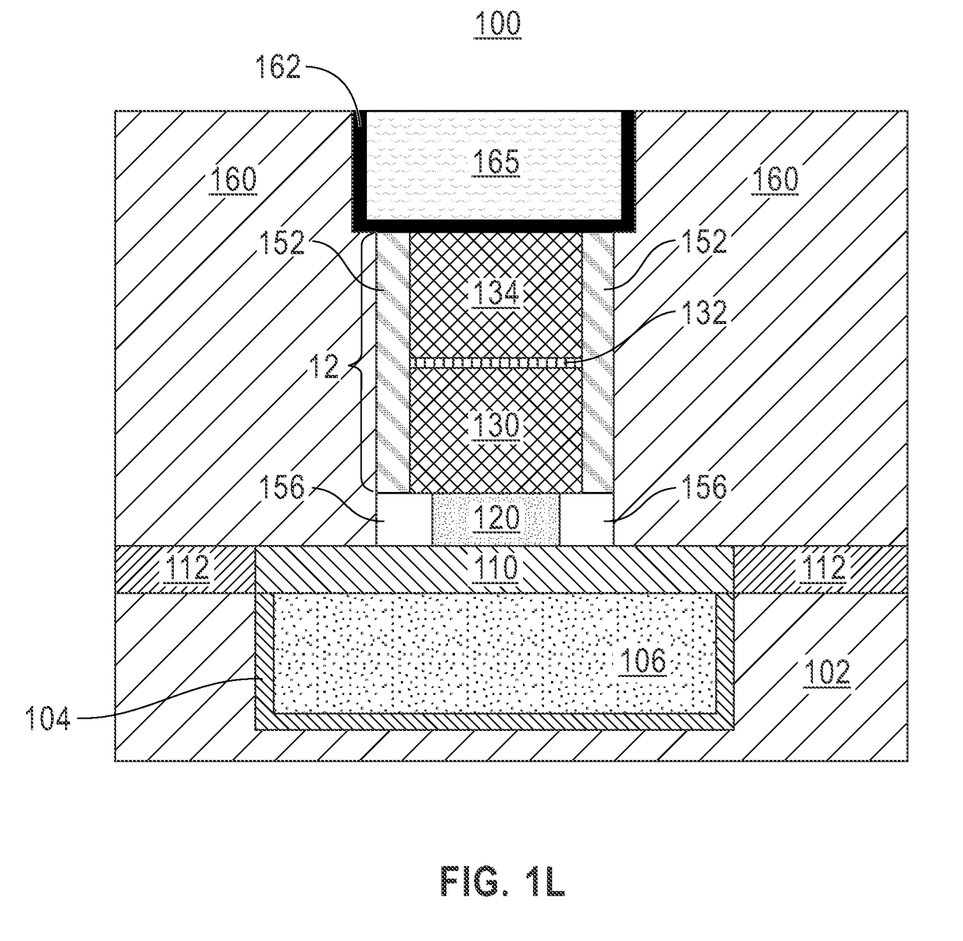
FIG. 1L is a cross-sectional view of the memory device after forming a second conductive structure, according to an embodiment of the present disclosure.

Referring now to FIG. 1K and FIG. 1L simultaneously, cross-sectional views of the memory device 100 are shown after forming a dielectric filling layer or third dielectric layer 160 and forming a second conductive structure 165 within the third dielectric layer 160, according to an embodiment of the present disclosure.

The third dielectric layer 160 may be made of analogous materials and formed in similar ways as the first dielectric layer 102 and second dielectric layer 112. In some embodiments, a planarization process may be conducted on the memory device 100 after deposition of the third dielectric layer 160.

The second conductive structure 165 may be formed in the third dielectric layer 160 in accordance with typical techniques. The second conductive structure 165 may consist of a line or wire found in a typical semiconductor circuit. According to an embodiment, the second conductive structure 165 may be fabricated using, for example, a dual damascene technique in which a conductive interconnect material may be deposited within a trench (not shown) formed in the second dielectric layer 160. In one embodiment, the second conductive structure 165 may include a second diffusion barrier liner 162 formed on a bottom surface and sidewalls of the second conductive structure 165, as shown in the figure Similar to the first conductive structure 106, the second conductive structure 165 may be composed of a conductive interconnect material such as Cu, Al, or W, while the second barrier liner 162 may include Ta, TaN, Ti, TiN, Ru, RuN, RuTa, RuTaN, W, or WN. The conductive interconnect material may be formed using a filling technique such as electroplating, electroless plating, chemical vapor deposition, physical vapor deposition or a combination of methods. A seed layer (not shown) may optionally be deposited prior to filling the trench using an electroplating technique. In one or more embodiments, a planarization process is conducted after forming the second conductive structure 165.

Accordingly, the previously described embodiments provide a memory device 100 in which the bottom electrode is composed of a metal-oxide layer (i.e., first metal-oxide layer 120) underneath the MTJ pillar 12 that is surrounded by an electrically conductive metal layer (i.e., first metal layer 156) formed after patterning the MTJ stack 10 (FIG. 1C). Formation of the first metal layer 156 after patterning the MTJ pillar 12 can prevent device shorts due to re-sputtering of bottom metal layers onto sidewalls of the MTJ stack 12.

Alternatively, a first metal liner 170 can be formed on the memory device 100 after conducting the steps of patterning the MTJ stack 10 and etching the first metal-oxide layer 120 described above with reference to FIGS. 1C-1H. This alternate process will be described in detail below with reference to FIGS. 2A-2E.

Referring now to FIGS. 2A-2D simultaneously, cross-sectional views of the memory device 100 are shown after forming a first metal liner 170, according to an alternate embodiment of the present disclosure.

After conducting the steps of patterning the MTJ pillar 12 and etching the first metal-oxide layer 156 as described in FIGS. 1C-1H, the first metal liner 170 can be conformally deposited on the memory device 100. The first metal liner 170 can be conformally deposited on the memory device 100 using, for example, an atomic layer deposition (ALD) process or a chemical vapor deposition (CVD) process. Similar to the first metal layer 156, the first metal liner 170 may be composed of an electrically conductive material such as, for example, Ta, TaN, Ti, TiN, Ru, RuN, RuTa, RuTaN, W, WN or any combination thereof.

Figure 2A:
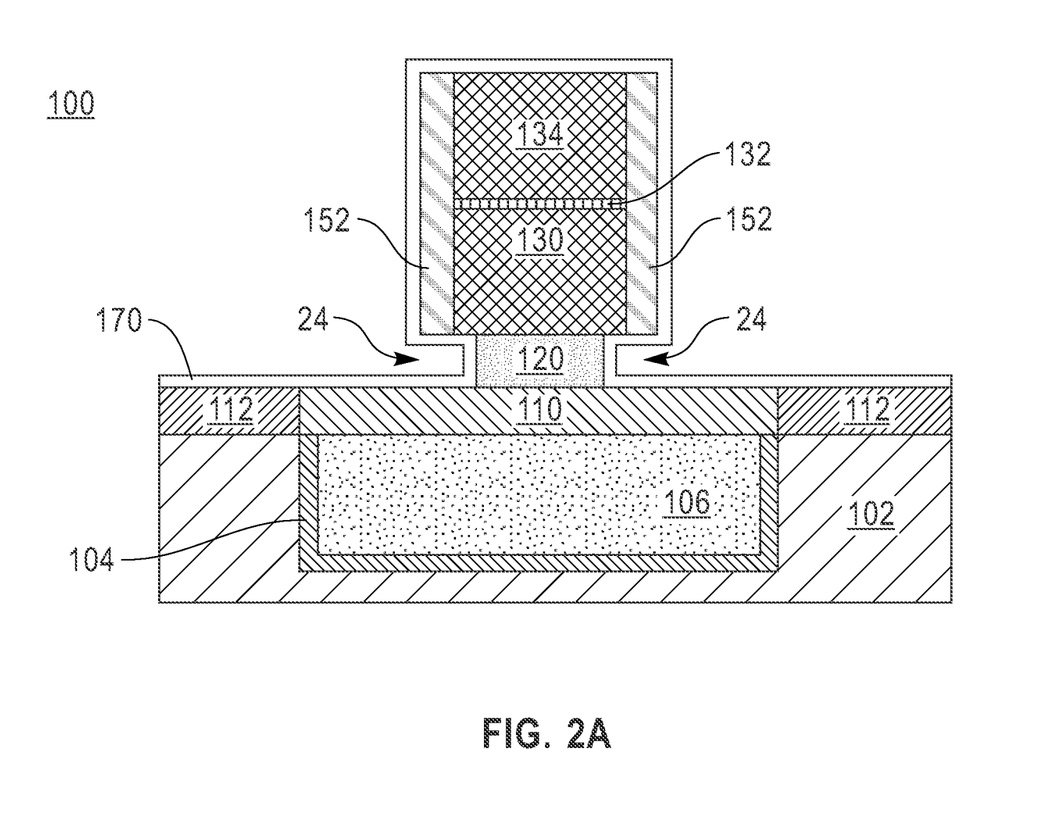
FIG. 2A is a cross-sectional view of the memory device after forming a first metal liner, according to an embodiment of the present disclosure.

In this embodiment, the first metal liner 170 deposits within a perimeter of the recesses 14 depicted in FIG. 1H. However, unlike the first metal layer 156, the first metal liner 170 does not completely fill the recesses 14 (FIG. 1H). Instead, after depositing the first metal liner 170 a cavity or opening 24 remains within inner sidewalls of the first metal liner 170, as depicted in the figure. As may be known by those skilled in the art, in embodiments in which the first metal liner 170 is formed using atomic layer deposition (ALD), a thickness of the first metal liner 170 depends on the number of deposition cycles. In an exemplary embodiment, the first metal liner 170 may have a thickness varying from approximately 2 nm to approximately 10 nm and ranges there between, although a thickness less than 2 nm and greater than 10 nm may be acceptable.

Figure 2B:
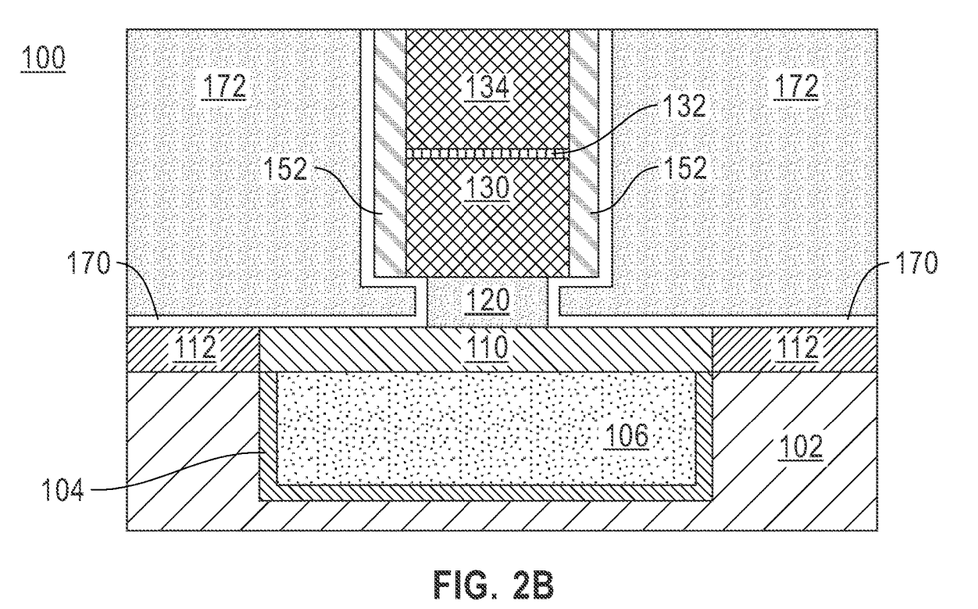
FIG. 2B is a cross-sectional view of the memory device after forming a second metal-oxide layer, according to an embodiment of the present disclosure.

The process continues by depositing a second metal-oxide layer 172, as depicted in FIG. 2B. The second metal-oxide layer 172 is formed above and in direct contact with the first metal liner 170. In this embodiment, the second metal-oxide layer 172 may include a layer of a dielectric material such as, for example, $Al_2O_3$, $TiO_2$, $HfO_2$, and the like. The second metal-oxide layer 172 may be formed by a deposition process such as, for example, sputtering, atomic layer deposition (ALD), chemical vapor deposition (CVD), plasma enhanced chemical vapor deposition (PECVD) or physical vapor deposition (PVD). A planarization process such as, for example, chemical mechanical polishing (CMP) may follow the deposition of the dielectric material that provides the second metal-oxide layer 172.

As can be observed in FIG. 2B, the second-metal oxide layer 172 completely fills the opening 24 shown in FIG. 2A.

Figure 2C:
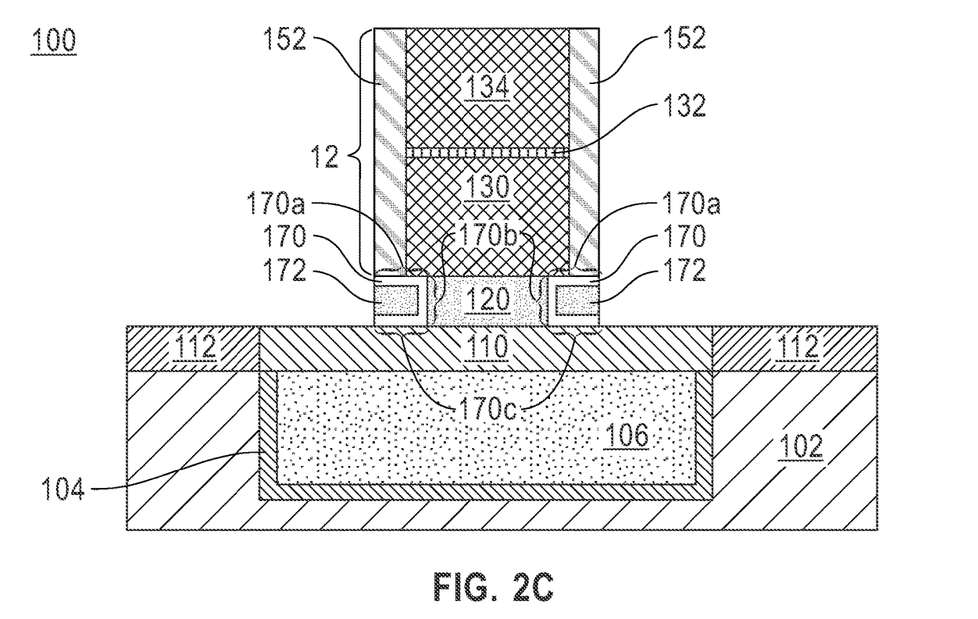
FIG. 2C is a cross-sectional view of the memory device after conducting an etch back process to remove portions of the first metal liner and the second metal-oxide layer, according to an embodiment of the present disclosure.

Following the formation of the second metal-oxide layer 172, an etch back process is conducted to remove portions of the first metal liner 170 and second metal-oxide layer 172 not covered by the MTJ pillar 12 and the sidewall spacers 152, as depicted in FIG. 2C. Stated differently, after conducting the etch back process, only portions of the first metal liner 170 and second metal-oxide layer 172 located underneath the MTJ pillar 12 and the sidewall spacers 152 remain in the memory device 100 (i.e., portions of the first metal liner 170 and second metal-oxide layer 172 filling the recesses 14 shown in FIG. 1H).

Thus, in this embodiment, the bottom electrode of the memory device 100 is composed of the first metal-oxide layer 120 that is directly below and in contact with a first (inner) portion of the MTJ pillar 12, the first metal liner 170, and the second metal-oxide layer 172. Particularly, the first metal liner 170 includes a first segment 170a in contact with a bottom surface of the sidewall spacers 152 and a second (outer) portion of the MTJ pillar 12, a second segment 170b in contact with the first metal-oxide 120, and a third segment 170c (parallel to the first segment 170a) in contact with the metal cap 110. In one or more embodiments, the first, second and third segments 170a, 170b, and 170c of the first metal liner 170 resemble a letter "C". More particularly, the first metal liner 170 has a shape that includes two horizontal segments (170a, 170c) parallel to each other, the two horizontal segments being connected or linked on one end by a vertical segment (170b) in the shape of the letter "C".

Although not depicted in the figure, it should be noted that the first metal liner 170 and the second metal-oxide layer 172 surrounds the first metal-oxide layer 120 located underneath the MTJ pillar 12 providing a ring-shaped bottom electrode.

Accordingly, by forming the first metal liner 170 and the second metal-oxide layer 172 after patterning the MTJ pillar 12, shorts across the tunnel barrier of the MTJ pillar 12 can be prevented.

Figure 2D:
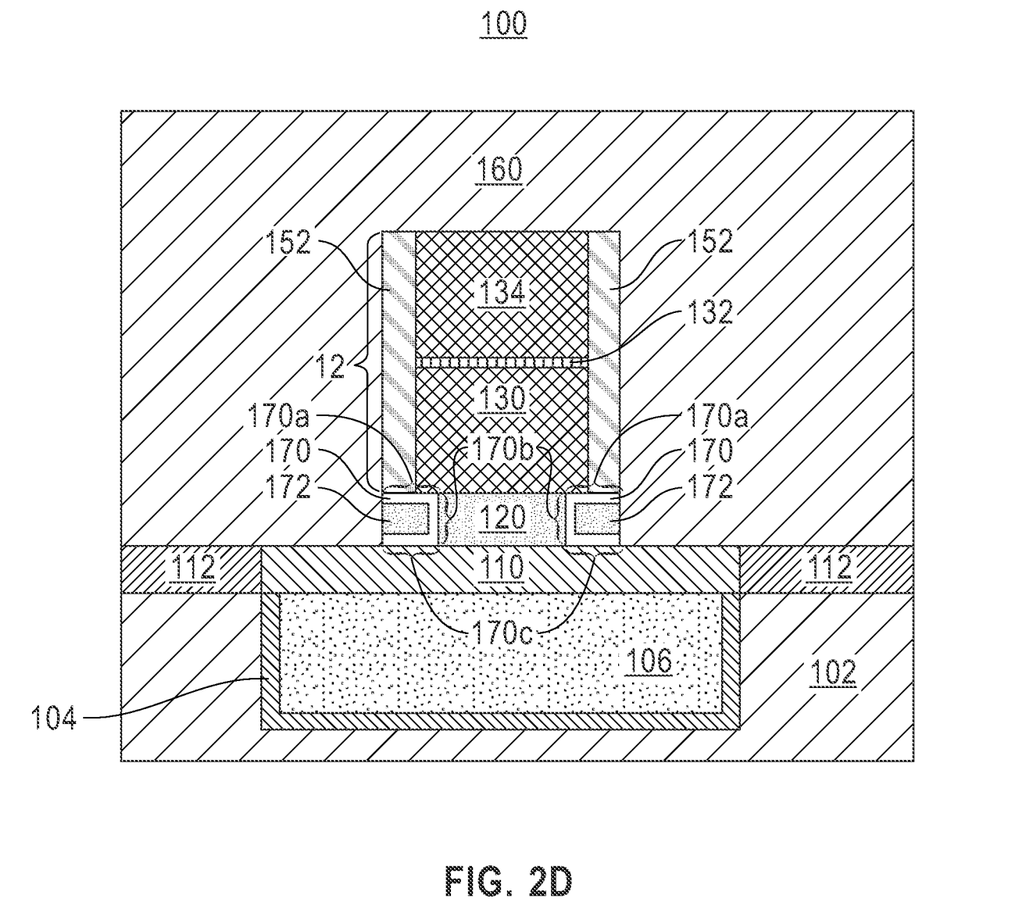
FIG. 2D is a cross-sectional view of the memory device after depositing the third dielectric layer, according to an embodiment of the present disclosure.
Figure 2E:
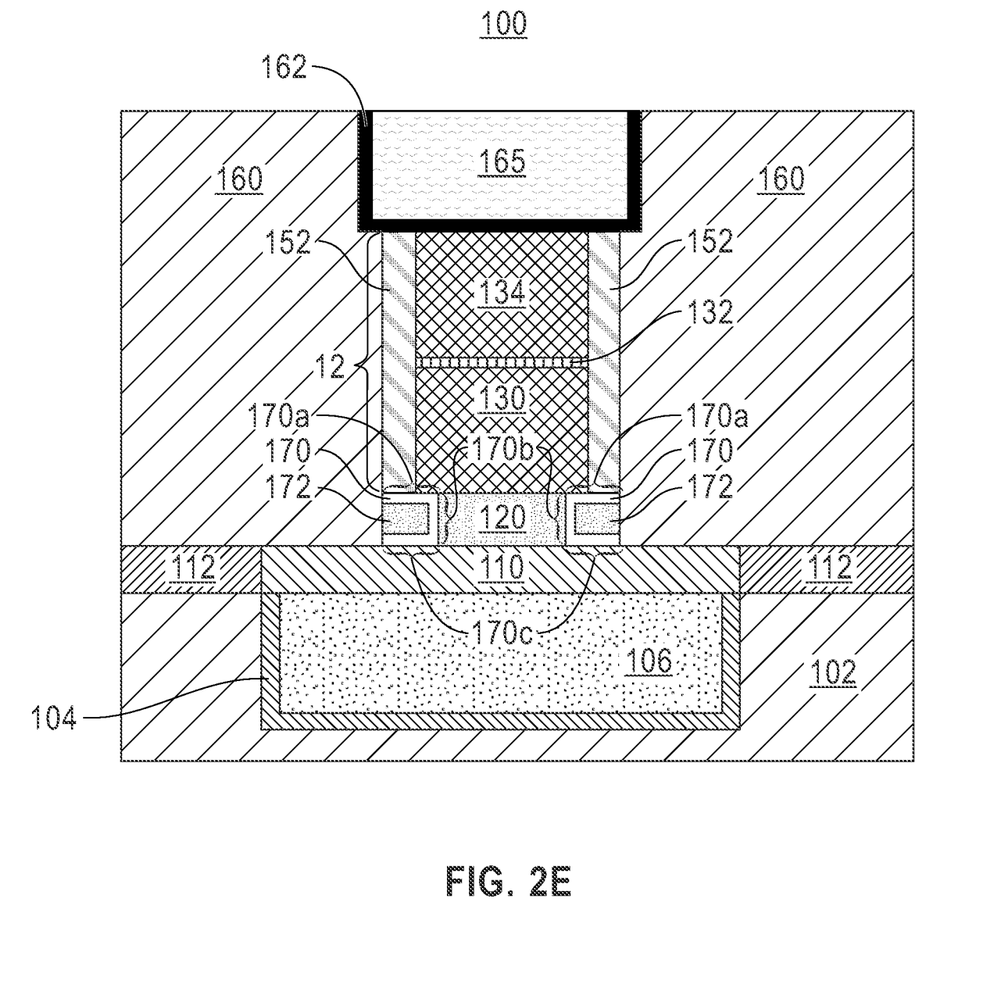
FIG. 2E is a cross-sectional view of the memory device after forming the second conductive structure, according to an embodiment of the present disclosure.

After forming the first metal liner 170 and the second metal-oxide layer 172, the process continues by depositing the third dielectric layer 160 (FIG. 2D) and forming the second conductive structure 165 (FIG. 2E). It should be noted that the processing steps depicted in FIGS. 2D-2E are similar to the processing steps described in FIGS. 1K-1L above. Thus, details of previously described features and techniques have been omitted to avoid unnecessarily obscuring the presented embodiments.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Spatially relative terms, such as "inner," "outer," "beneath," "below," "lower," "above," "upper," "top," "bottom," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" may encompass both an orientation of above and below. The device may be otherwise oriented (rotated 90 degrees or at other orientations) and the spatially relative descriptors used herein interpreted accordingly.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A memory device, comprising:
    a magnetic tunnel junction pillar above a bottom electrode, the bottom electrode including a metal-oxide region in contact with a first portion of the magnetic tunnel junction pillar and a metal region surrounding the metal-oxide region; and
    a sidewall spacer along sidewalls of the magnetic tunnel junction pillar, the metal region being in contact with a bottom surface of the sidewall spacer and a second portion of the magnetic tunnel junction pillar.

2. The memory device of claim 1, further comprising:
    a first conductive structure within a first dielectric layer; and
    a metal cap above the first conductive structure, the metal cap being formed within a second dielectric layer located above the first dielectric layer, the bottom electrode being located above the metal cap.

3. The memory device of claim 1, further comprising:
    a second conductive structure above the magnetic tunnel junction pillar, the second conductive structure being located within a third dielectric layer.

4. The memory device of claim 1, wherein the metal region comprises a layer of a conductive metal including at least one of Ta, TaN, Ti, TiN, Ru, RuN, RuTa, RuTaN, W, and WN.

5. The memory device of claim 1, wherein the metal-oxide region comprises a layer of a dielectric material including at least one of $Al_2O_3$, $TiO_2$, and $HfO_2$.

6. A memory device, comprising:
a magnetic tunnel junction pillar above a bottom electrode; and
a sidewall spacer along sidewalls of the magnetic tunnel junction pillar, the bottom electrode including:
a first region below a first portion of the magnetic tunnel junction pillar, the first region including a first metal-oxide layer, and
a second region on opposite sides of the first region, the second region including a metal liner surrounding a second metal-oxide layer, a first segment of the metal liner being in contact with a bottom surface of the sidewall spacer and a second portion of the magnetic tunnel junction pillar, a second segment of the metal liner being in contact with the first metal-oxide layer, and a third segment of the metal liner, parallel to the first segment, being in contact with a metal cap located underneath the bottom electrode.

7. The memory device of claim 6, further comprising:
a first conductive structure within a first dielectric layer.

8. The memory device of claim 7, wherein the metal cap is above the first conductive structure, the metal cap being formed within a second dielectric layer located above the first dielectric layer.

9. The memory device of claim 6, further comprising:
a second conductive structure above the magnetic tunnel junction pillar, the second conductive structure being located within a third dielectric layer.

10. The memory device of claim 6, wherein the metal liner comprises a conformal layer of a conductive metal including at least one of Ta, TaN, Ti, TiN, Ru, RuN, RuTa, RuTaN, W, and WN.

11. The memory device of claim 6, wherein the first metal-oxide layer comprises a layer of a first dielectric material including at least one of $Al_2O_3$, $TiO_2$, and $HfO_2$.

12. The memory device of claim 6, wherein the second metal-oxide layer comprises a layer of a second dielectric material including at least one of $Al_2O_3$, $TiO_2$, and $HfO_2$.

13. A memory device, comprising:
a magnetic tunnel junction pillar upon a bottom electrode; and
a sidewall spacer upon one or more sidewalls of the magnetic tunnel junction pillar;
wherein the bottom electrode comprises a first metal-oxide region in direct contact with a first portion of the magnetic tunnel junction pillar, a metal liner in direct contact with the first metal-oxide region and in direct contact with the sidewall spacer, and a second metal-oxide region upon the metal liner.

14. The memory device of claim 13, further comprising:
a first conductive structure within a first dielectric layer; and
a metal cap directly connected to the first conductive structure and within a second dielectric layer that is located above the first dielectric layer, wherein the bottom electrode is directly connected to the metal cap.

15. The memory device of claim 13, further comprising:
a second conductive structure directly connected to the magnetic tunnel junction pillar and within a third dielectric layer.

16. The memory device of claim 13, wherein the metal liner is composed of a conductive metal including at least one of Ta, TaN, Ti, TiN, Ru, RuN, RuTa, RuTaN, W, and WN.

17. The memory device of claim 13, wherein the first metal-oxide region is composed of a material including at least one of $Al_2O_3$, $TiO_2$, and $HfO_2$.

18. The memory device of claim 13, wherein the second metal-oxide region is composed of a material including at least one of $Al_2O_3$, $TiO_2$, and $HfO_2$.

19. The memory device of claim 13, wherein respective sidewalls of the sidewall spacer, the metal liner, and the second metal-oxide region share a same vertical surface.

20. The memory device of claim 15, wherein the third dielectric layer is directly connected to the sidewall spacer, the metal liner, and the second metal-oxide region.

* * * * *